US012779620B2

(12) United States Patent

Terakawa et al.

(10) Patent No.: US 12,779,620 B2

(45) Date of Patent: *Nov. 3, 2026

(54) POLISHING HEAD, POLISHING DEVICE, AND METHOD OF MANUFACTURING SEMICONDUCTOR WAFER

(71) Applicant: SUMCO CORPORATION, Tokyo (JP)

(72) Inventors: Ryoya Terakawa, Saga (JP); Hiroki Ota, Saga (JP)

(73) Assignee: SUMCO CORPORATION, Tokyo (JP)

( * ) Notice: Subject to any disclaimer, the term of this patent is extended or adjusted under 35 U.S.C. 154(b) by 363 days.

This patent is subject to a terminal disclaimer.

(21) Appl. No.: 18/570,231

(22) PCT Filed: Apr. 21, 2022

(86) PCT No.: PCT/JP2022/018384

§ 371 (c)(1),
(2) Date: Dec. 14, 2023

(87) PCT Pub. No.: WO2022/264687

PCT Pub. Date: Dec. 22, 2022

(65) Prior Publication Data

US 2024/0278381 A1 Aug. 22, 2024

(30) Foreign Application Priority Data

Jun. 16, 2021 (JP) ................................. 2021-099930

(51) Int. Cl.

*B24B 37/30* (2012.01)
*B24B 37/04* (2012.01)
(Continued)

(52) U.S. Cl.

CPC ............ *B24B 37/30* (2013.01); *B24B 37/042* (2013.01); *B24B 37/12* (2013.01); *B24B 37/20* (2013.01); *H10P 52/00* (2026.01); *H10P 90/129* (2026.01)

(58) Field of Classification Search

CPC ....... B24B 37/20; B24B 37/042; B24B 37/04; B24B 37/32; B24B 37/12; B24B 37/30;
(Continued)

(56) References Cited

U.S. PATENT DOCUMENTS 5,916,015 A * 6/1999 Natalicio ................ B24B 37/30 451/388
6,494,774 B1 * 12/2002 Zuniga .................... B24B 37/30 451/41
(Continued)

FOREIGN PATENT DOCUMENTS

JP 2003-528738 A 9/2003
JP 4833355 B2 9/2011
(Continued)

OTHER PUBLICATIONS

International Search Report issued in WIPO Patent Application No. PCT/JP2022/018384, dated Jun. 21, 2022, along with an English translation thereof.
(Continued)

*Primary Examiner* — Monica S Carter
*Assistant Examiner* — Kent N Shum
(74) *Attorney, Agent, or Firm* — Greenblum & Bernstein, P.L.C.

(57) ABSTRACT

A polishing head having a first annular member, a closing member, a membrane, and a second annular member situated under the membrane and having an opening which holds a work to be polished. A space, which is formed by closing the opening of the first annular member with the closing member and the membrane, is partitioned into an inside space and an outside space with an annular partition wall having a top annular connection part connected to the closing member and a bottom annular connection part connected to the membrane, the inside diameter of the
(Continued)

bottom annular connection part of the annular partition wall is larger than the inside diameter of the second annular member, and the outer circumferential region of the setting position of the work to be polished is situated vertically under the top annular connection part of the annular partition wall.

7 Claims, 5 Drawing Sheets

(51) Int. Cl.
*B24B 37/12* (2012.01)
*B24B 37/20* (2012.01)
*H10P 52/00* (2026.01)
*H10P 90/00* (2026.01)

(58) Field of Classification Search
CPC ....... B24B 37/10; B24B 37/27; H10P 90/129; H10P 90/00; H10P 52/00
USPC .......................................... 451/285–288, 398
See application file for complete search history.

(56) References Cited

U.S. PATENT DOCUMENTS

| | | | | |
|---|---|---|---|---|
| 6,511,367 | B2 * | 1/2003 | Zuniga | B24B 37/32 451/388 |
| 6,695,687 | B2 * | 2/2004 | Hollatz | B24B 41/06 451/388 |
| 6,923,714 | B1 * | 8/2005 | Zuniga | B24B 37/30 451/388 |
| 9,266,216 | B2 * | 2/2016 | Masumura | B24B 37/10 |
| 2002/0025769 | A1 | 2/2002 | Oliver | |
| 2002/0094767 | A1 | 7/2002 | Zuniga et al. | |
| 2002/0182996 | A1 | 12/2002 | Zuniga et al. | |
| 2008/0176486 | A1 | 7/2008 | Saito | |
| 2011/0053474 | A1 * | 3/2011 | Moriya | B24B 37/30 451/288 |
| 2011/0136414 | A1 | 6/2011 | Masumura et al. | |
| 2012/0052774 | A1 * | 3/2012 | Moriya | B24B 37/30 451/67 |
| 2012/0289129 | A1 | 11/2012 | Hashimoto et al. | |
| 2014/0113531 | A1 | 4/2014 | Masumura | |
| 2014/0242886 | A1 * | 8/2014 | Woo | B24B 41/047 451/286 |
| 2018/0311783 | A1 * | 11/2018 | Terakawa | B24B 37/30 |
| 2019/0358768 | A1 * | 11/2019 | Kang | B24B 37/32 |
| 2022/0161388 | A1 | 5/2022 | Nakano et al. | |

FOREIGN PATENT DOCUMENTS

| | | | | |
|---|---|---|---|---|
| JP | 2012-51037 | A | 3/2012 | |
| JP | 2019-193968 | A | 11/2019 | |
| TW | 515739 | B | 1/2003 | |
| TW | 201026436 | A1 | 7/2010 | |
| TW | 201200294 | A1 | 1/2012 | |
| TW | 201210741 | A1 | 3/2012 | |
| TW | 202039153 | A | 11/2020 | |
| WO | 01/72472 | A2 | 10/2001 | |
| WO | 02/16080 | A2 | 2/2002 | |
| WO | 2013/001719 | A1 | 1/2013 | |
| WO | WO-2020202682 | A1 * | 10/2020 | H01L 21/30625 |

OTHER PUBLICATIONS

Office Action issued in Taiwan Counterpart Patent Appl. No. 111115190, dated Feb. 8, 2023, along with an English translation thereof.
International Preliminary Report on Patentability issued in WIPO Patent Application No. PCT/JP2022/018384, dated Dec. 14, 2023, along with an English translation thereof.
Office Action issued in Corresponding Korean Patent Application No. 10-2023-7041764, dated Dec. 2, 2024, along with an English translation thereof.
Office Action issued in Corresponding JP Patent Application No. 2021-099930, dated Oct. 8, 2024, along with an English translation thereof.
Office Action issued in Corresponding CN Patent Application No. 202280039672.6, dated May 1, 2026, along with an English translation thereof.

* cited by examiner

POLISHING HEAD, POLISHING DEVICE, AND METHOD OF MANUFACTURING SEMICONDUCTOR WAFER

CROSS REFERENCE TO RELATED APPLICATIONS

This application claims the benefit of priority to Japanese Patent Application No. 2021-099930 filed on Jun. 16, 2021, which is expressly incorporated herein by reference in its entirety.

TECHNICAL FIELD

The present invention relates to a polishing head, a polishing device, and a method of manufacturing a semiconductor wafer.

BACKGROUND ART

The devices for polishing the surface of a work such as a semiconductor wafer include a one-side polishing device for polishing one side of a work, and a both-side polishing device at the time of polishing both sides of a work. With the one-side polishing device, normally, while pressing the surface to be polished of a work held by a polishing head against a polishing pad bonded to a surface plate, the polishing head and the surface plate are rotated, respectively, thereby bringing the surface to be polished of the work and the polishing pad into sliding contact with each other. By supplying an abrasive to between the surface to be polished and the polishing pad thus coming in sliding contact with each other, it is possible to polish the surface to be polished of the work.

As the method of pressing the work held by the polishing head against the polishing pad in the one-side polishing device as described above, a rubber chuck system is known (see WO 2020/202682 and Japanese Patent No. 4833355, which are expressly incorporated herein by reference in their entirety).

SUMMARY OF INVENTION

With the polishing head of the rubber chuck system, by introducing a gas such as air into the space at the back surface of a membrane (which is referred to as a rubber film in Japanese Patent No. 4833355), and thereby swelling the membrane, it is possible to press the work.

With the polishing head described in WO 2020/202682, the space is partitioned into two spaces, and the amounts of the gas to be introduced into respective spaces are adjusted, respectively, thereby enabling independent control of the polished surface pressure to be applied to the outer circumferential region of the surface to be polished of the work and the polished surface pressure to be applied to the central part (see paragraph 0009 of WO 2020/202682, and the like). Japanese Patent No. 4833355 also discloses a polishing head with the space partitioned into two spaces (see FIG. 1 of Japanese Patent No. 4833355, and the like). Below, the polishing head with the space at the back surface of the membrane partitioned into two spaces will be referred to as a two-zone membrane head. The present inventors studied the two-zone membrane head described in WO 2020/202682, and the two-zone membrane head described in Japanese Patent No. 4833355, and proved that it is difficult to combine the control of the polishing amount of the outer circumferential region of the surface to be polished of the work, and the suppression of local fluctuations in polishing amount at the surface to be polished.

One aspect of the present invention provides for a two-zone membrane head capable of combining the control of the polishing amount of the outer circumferential region of the surface to be polished of the work, and the suppression of local fluctuations in polishing amount at the surface to be polished.

One aspect of the present invention relates to:

a polishing head having:

a first annular member, a closing member which closes the upper surface side opening of the opening of the first annular member, a membrane which closes the lower surface side opening of the opening of the first annular member, and a second annular member situated under the membrane, and having an opening which holds a work to be polished, in which with the direction toward the center of the opening of the first annular member assumed as the inside, and with the other direction assumed as the outside, the space, which is formed by closing the opening of the first annular member with the closing member and the membrane, is partitioned into an inside space and an outside space with an annular partition wall having a top annular connection part connected to the closing member and a bottom annular connection part connected to the membrane, the inside diameter of the bottom annular connection part of the annular partition wall is larger than the inside diameter of the second annular member, and the outer circumferential region of the setting position of the work to be polished is situated vertically under the top annular connection part of the annular partition wall.

With the polishing head (two-zone membrane head) in accordance with one aspect of the present invention, it is possible to combine control of the polishing amount of the outer circumferential region of the surface to be polished of the work, and the suppression of local fluctuations in polishing amount at the surface to be polished. The presumption by the present inventors regarding this point is as follows.

When a work is polished using the polishing head shown in WO 2020/202682, the outer circumferential region of the surface to be polished of the work is situated vertically under the connection part between the partition for partitioning the space at the back surface of the membrane and the membrane (see, for example, FIG. 1 of WO 2020/202682). The pressure to be applied vertically downward from the two spaces divided with the partition can be controlled by the amount of a gas to be introduced into each region. However, it is not easy to control the pressure to be applied vertically downward of the partition, which is normally smaller than the pressures to be applied vertically downward from the two spaces, respectively. This can be considered to be the reason why the local fluctuations in polishing amount (specifically, the local reduction of the polishing amount vertically under the connection part) tends to be caused with the work polished using the polishing head shown in WO 2020/202682.

In contrast, with the polishing head in accordance with one aspect of the present invention, the inside diameter of the bottom annular connection part, which is the connection part of the annular partition wall for dividing the two spaces with the membrane, is larger than the inside diameter of the second annular member. Therefore, when polishing is performed using the polishing head, vertically under the bottom annular connection part, the second annular member is situated, and the outer circumferential region of the surface to be polished of the work is not situated. The present inventors consider this point as the reason why the surface to be polished of the work can be polished while suppressing the local reduction of the polishing amount vertically under the connection part by using the polishing head.

Further, with the polishing head in accordance with one aspect of the present invention, for the connection part of the annular partition wall, the outer circumferential region of the setting position of the work to be polished is situated vertically under the top annular connection part, and the inside diameter of the bottom annular connection part is larger than the inside diameter of the second annular member. For these reasons, the second annular member is situated vertically under the bottom annular connection part. In contrast, with the polishing head shown in FIG. 1 of Japanese Patent No. 4833355, the inside diameter of the connection part of the partition with the membrane is smaller than the inside diameter of the second annular member. As compared with the polishing head with such a configuration, with the polishing head in accordance with one aspect of the present invention, it is possible to more effectively control the pressure to be applied downward from the outside space by adjusting the amount of the gas to be introduced into the outside space divided by the annular partition wall. As a result, it becomes possible to easily control the polishing amount of the outer circumferential region of the surface to be polished of the work by adjusting the amount of the gas to be introduced into the outside space. This is presumed by the present inventors. Although the presumption by the present inventors is described in the present specification, the present invention is not limited to such presumption.

In one embodiment, the annular partition wall can include a side surface shape selected from the group consisting of an inclined shape and a horizontal shape in the cross-sectional shape. Vertically under at least a part of the side surface shape, the inside circumferential end of the second annular member and the outside circumferential end of the setting position of the work to be polished can be situated.

In one embodiment, the closing member can include a top disk-shaped member and a bottom disk-shaped member with a smaller outside diameter than that of the top disk-shaped member. The annular partition wall can be configured such that the top annular connection part is connected to the side surface of the bottom disk-shaped member.

In one embodiment, the polishing head can further have a back pad between the membrane and the second annular member.

In one embodiment, the polishing head can have an introduction path which introduces a gas into the inside space, and an introduction path which introduces a gas into the outside space.

One aspect of the present invention relates to:

a polishing device, having:

the above polishing head, a polishing pad, and a surface plate which supports the polishing pad.

Another aspect of the present invention relates to a method of manufacturing a semiconductor wafer, including: polishing the surface of a semiconductor wafer to be polished with the above polishing device to form a polished surface.

In accordance with one aspect of the present invention, it becomes possible to provide a two-zone membrane head capable of combining control of the polishing amount of the outer circumferential region of the surface to be polished of the work and suppression of local fluctuations in polishing amount at the surface to be polished.

DESCRIPTION OF EMBODIMENTS

[Polishing Head]

Figure 1:
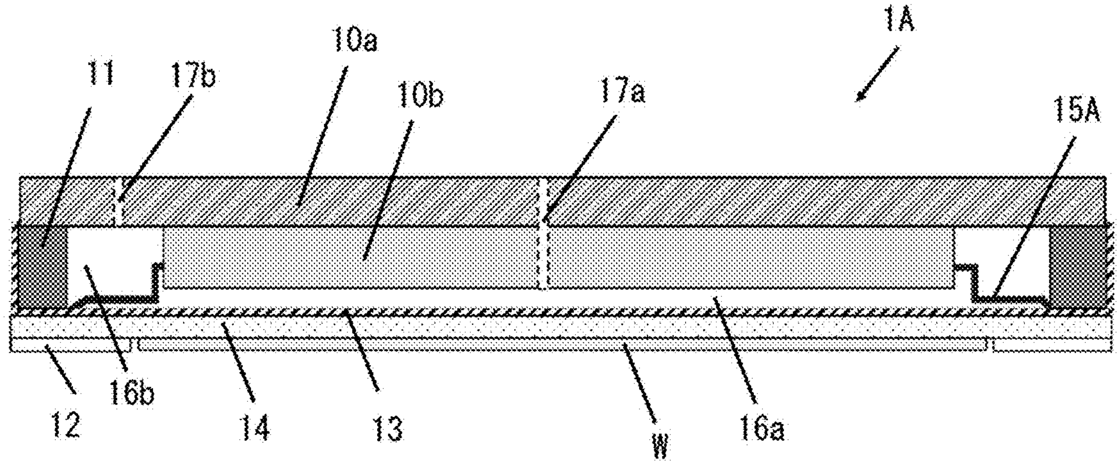
FIG. 1 is a schematic cross-sectional view showing one example of a polishing head in accordance with one aspect of the present invention.

A polishing head in accordance with one aspect of the present invention has a first annular member, a closing member which closes the upper surface side opening of the opening of the first annular member, a membrane which closes the lower surface side opening of the opening of the first annular member, and a second annular member situated under the membrane and having an opening which holds a work to be polished. In the polishing head, with the direction toward the center of the opening of the first annular member assumed as the inside, and with the other direction assumed as the outside, the space, which is formed by closing the opening of the first annular member with the closing member and the membrane, is partitioned into an inside space and an outside space with an annular partition wall having a top annular connection part connected to the closing member and a bottom annular connection part connected to the membrane, the inside diameter of the bottom annular connection part of the annular partition wall is larger than the inside diameter of the second annular member, and the outer circumferential region of the setting position of the work to be polished is situated vertically under the top annular connection part of the annular partition wall.

Below, the polishing head will be further described in details. In the present invention and in the present specification, the expressions of “lower surface”, “under”, “upper surface”, “top”, “bottom”, and the like mean “lower surface”, “under”, “upper surface”, “top”, “bottom”, and the like when the polishing head is placed in a state in which a polishing process is performed. In the present invention and in the present specification, for the expressions "inclined" and "horizontal", the case where the polishing head is inclined with respect to the horizontal direction when the polishing head is placed in a state in which a polishing process is performed is referred to as "inclined", and the case where the polishing head is in parallel with such a horizontal direction is referred to as "horizontal". Further, the direction toward the center of the opening of the first annular member is referred to as inside, and the other direction is referred to as outside. The term "annular" means the shape having an opening, and the shape of the opening in a plan view can be a circular shape. Below, the present invention will be described by way of the accompanying drawings. However, the embodiments shown in the drawings are illustrative, and the present invention is not limited to such embodiments. Further, the same portions are given the same reference numerals and signs in the drawings.

FIGS. 1, and 5 to 7 are each a schematic cross-sectional view showing one example of the polishing head in accordance with one aspect of the present invention. A polishing head 1A in FIG. 1, a polishing head 1B in FIG. 5, a polishing head 1C in FIG. 6, and a polishing head 1D in FIG. 7 may be collectively referred to as a polishing head 1. Further, an annular partition wall 15A in FIG. 1, an annular partition wall 15B in FIG. 5, an annular partition wall 15C in FIG. 6, and an annular partition wall 15D in FIG. 7 may be collectively referred to as an annular partition wall 15. In each drawing of FIGS. 1, and 5 to 7, the head main body is not shown. Above the portion shown in each drawing of FIGS. 1, and 5 to 7, a head main body is situated, and the portion shown in each drawing is mounted on the head main body by a known method such as fastening by a bolt.

In each drawing of FIGS. 1, and 5 to 7, the polishing head 1 has a first annular member 11. The first annular member 11 has an annular upper surface and an annular lower surface. The inside diameter of the upper surface is the same value as that of the inside diameter of the lower surface, and the outside diameter of the upper surface is the same value as that of the outside diameter of the lower surface. That is, the first annular member 11 has a cylindrical outside shape, and the shape of the opening is also a cylindrical shape. This also applies to a second annular member 12 described later. In the present invention and in the present specification, the term "the same value" is used as the meaning including the case of perfect match, and the case including an error that can be caused inevitably in manufacturing. This also applies to the term regarding the shape such as a cylindrical shape. As the first annular member 11, there can be used an annular ring made of a rigid material such as stainless steel material (SUS) to be normally used for the polishing head of a one-side polishing device.

The lower surface of the first annular member 11 is covered with a membrane 13. The membrane 13 may close at least the lower surface side opening of the first annular member 11. From the viewpoint of suppressing the occurrence of misalignment when the membrane 13 is swollen, and the viewpoint of suppressing mixing of an abrasive into the opening of the first annular member 11, the entire annular lower surface of the first annular member 11 is also preferably covered with the membrane 13. The membrane 13 can be bonded with the annular lower surface of the first annular member 11 by a known method such as use of an adhesive. Further, as shown in each drawing of FIGS. 1, and 5 to 7, the membrane 13 is also preferably bonded so as to extend over a part of, or the whole of the side surface of the first annular member 11. As the membrane 13, a film made of a material having elasticity such as rubber can be used. Examples of the rubber may include fluoro-rubber. The thickness of the membrane 13 has no particular restriction, and can be, for example, about 0.5 to 2 mm.

In each drawing of FIGS. 1, and 5 to 7, the lower surface of the membrane 13 is bonded with a back pad 14. The back pad 14 can be bonded with the lower surface of the membrane 13 by a known method such as use of an adhesive. The outer circumferential region of the lower surface of the membrane 13 and the annular upper surface of the second annular member 12 can come in direct contact with each other. However, from the viewpoint of suppressing peeling of the membrane 13 and the occurrence of undulation, the back pad 14 is preferably interposed between the outer circumferential region of the lower surface of the membrane 13 and the annular upper surface of the second annular member 12. As the back pad 14, for example, a disk-shaped sheet made of a material showing an adsorptive property due to the surface tension of water upon containing water (for example, foamed polyurethane) can be used. As a result of this, the back pad 14 containing water upon polishing can be allowed to hold a work.

In each of FIGS. 1, and 5 to 7, the membrane 13 closes the lower surface side opening of the first annular member 11. The upper surface side opening of the first annular member 11 is closed with a closing member formed of a top disk-shaped member 10*a* and a bottom disk-shaped member 10*b*. The bottom disk-shaped member 10*b* is a disk-shaped member with a smaller outside diameter than that of the top disk-shaped member 10*a*. The top disk-shaped member 10*a* and the bottom disk-shaped member 10*b* can be each a disk-shaped flat sheet with the upper surface outside diameter and the lower surface outside diameter being the same value, and can be arranged, for example, coaxially. In each drawing of FIGS. 1, and 5 to 7, the top disk-shaped member 10*a* and the bottom disk-shaped member 10*b* are different members, and are each fixed by any means (for example, a method in which a concave part is provided in one member, and a convex part is provided in the other member, so that the convex part is fitted in the concave part, fastening with a bolt, or bonding with an adhesive). However, the polishing head in accordance with one aspect of the present invention is not limited to such a configuration. The closing member can be a member including a top disk-shaped member and a bottom disk-shaped member with a smaller outside diameter than that of the top disk-shaped member formed integrally with each other therein. The material forming the closing member has no particular restriction. In each drawing of FIGS. 1, and 5 to 7, W shows the setting position of a work. At the time of polishing a work, when a gas is introduced into the space surrounded by the first annular member 11, the membrane 13, and the closing member, the membrane 13 is swollen. As a result of this, the work set at the work setting position W is pressed via the back pad 14, so that polishing is performed.

In each drawing of FIGS. 1, and 5 to 7, the space surrounded by the first annular member 11, the membrane 13, and the closing member is partitioned into an inside space 16*a* and an outside space 16*b* with the annular partition wall 15. The annular partition wall 15 can be manufactured by, for example, forming a material having elasticity such as rubber into a desirable shape. Examples of rubber may include fluoro-rubber. The thickness of the annular partition wall 15 can be set at, for example, about 0.5 to 1.5 mm. A gas can be introduced into the inside space 16*a* through a gas introduction path 17*a* penetrating through the top disk-shaped member 10*a* and the bottom disk-shaped member 10*b* at the central part of the closing member, and into the outside space 16*b* through a gas introduction path 17*b* penetrating through the top disk-shaped member 10*a* in the outer circumferential region of the closing member by controlling the gas introduction amounts each independently. At the time of polishing a work, for example, by varying the amount of the gas to be introduced into the inside space 16*a* through the gas introduction path 17*a* and the amount of the gas to be introduced into the outside space 16*b* through the gas introduction path 17*b*, it is possible to control the polished surface pressure to be applied to the outer circumferential region of the surface to be polished of the work under the outside space 16*b* independently of the polished surface pressure to be applied to the central part of the surface to be polished of the work under the inside space 16*a*. In each drawing of FIGS. 1, and 5 to 7, there are one gas introduction path 17*a* and one gas introduction path 17*b*. However, the present invention is not limited to such an embodiment, and two or more gas introduction paths 17*a* can be provided, and two or more gas introduction paths 17*b* can be provided.

In each drawing of FIGS. 1, and 5 to 7, a second annular member 12 is arranged under the membrane 13 via the back pad 14. The second annular member 12 is an annular member having an opening which holds a work to be polished. Such an annular member is generally also referred to as a retainer, a retainer ring, a template, or the like. The second annular member 12 can be an annular member made of a material to be commonly used for an annular member referred to as a retainer of a polishing head, or the like (for example, made of glass epoxy).

Figure 2:
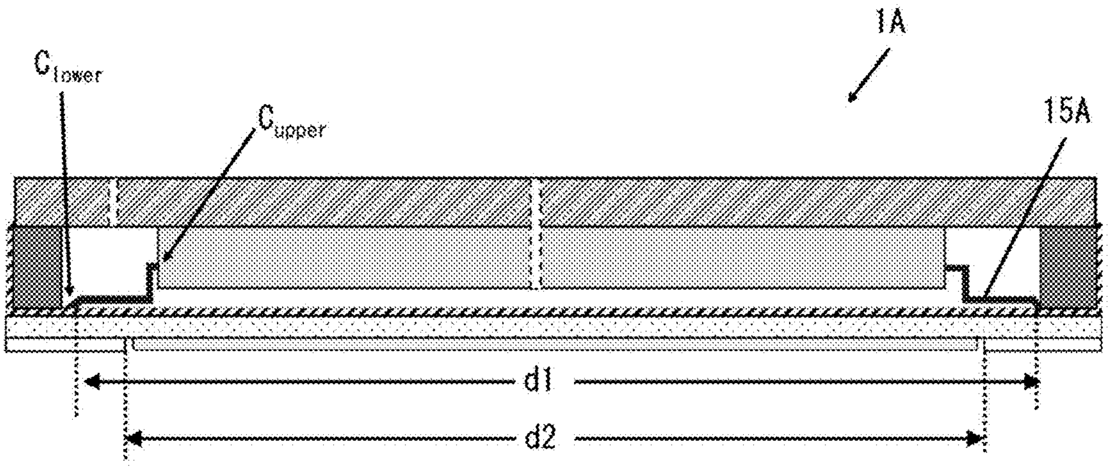
FIG. 2 is an explanatory view of a connection part of an annular partition wall 15A in a polishing head 1A shown in FIG. 1.

FIG. 2 is an explanatory view of the connection part (particularly, the bottom annular connection part) of the annular partition wall 15A in the polishing head 1A shown in FIG. 1. The annular partition wall 15A is configured such that the top annular connection part $C_{upper}$ is connected with the closing member, and such that the bottom annular connection part $C_{lower}$ is connected with the membrane 13. Particularly, the top annular connection part $C_{upper}$ is connected with the side surface of the bottom disk-shaped member 10*b* of the closing member, and the bottom annular connection part $C_{lower}$ is connected with the upper surface of the membrane 13. As the connection means for respective connections, mention may be made of use of an adhesive, integral forming, fitting of the convex part into the concave part, or the like. For the polishing head in accordance with one aspect of the present invention, the inside diameter d1 of the bottom annular connection part of the annular partition wall is larger than the inside diameter d2 of the second annular member, where d1 represents the inside diameter of the bottom annular connection part of the annular partition wall, and d2 represents the inside diameter of the second annular member. That is, the relationship "d1>d2" is satisfied. Therefore, at the time of polishing a work, vertically under the bottom annular connection part of the annular partition wall, the second annular member is situated, and the outer circumferential region of the surface to be polished of the work is not situated. In contrast, for the polishing head shown in WO 2020/202682 described previously, the outer circumferential region of the surface to be polished of the work is situated vertically under the connection part of the partition (see, for example, FIG. 1 of WO 2020/202682). As described previously, this can be considered to be the reason why local fluctuations in polishing mount (specifically, the local reduction of the polishing amount vertically under the connection part) tends to be caused in the work polished using the polishing head shown in WO 2020/202682. In contrast, with the polishing head in accordance with one aspect of the present invention, by satisfying the relationship of "d1>d2", it is possible to suppress the local reduction of the polishing amount vertically under the connection part, and to polish the surface to be polished of the work. This is considered by the present inventors. When d2 is assumed to be 100%, d1 is more than 100%, preferably more than 102%, and more preferably 103% or more. d1 can be 120% or less or 110% or less with d2 assumed to be 100%, or can exceed, for example, the values shown herein.

Figure 3:
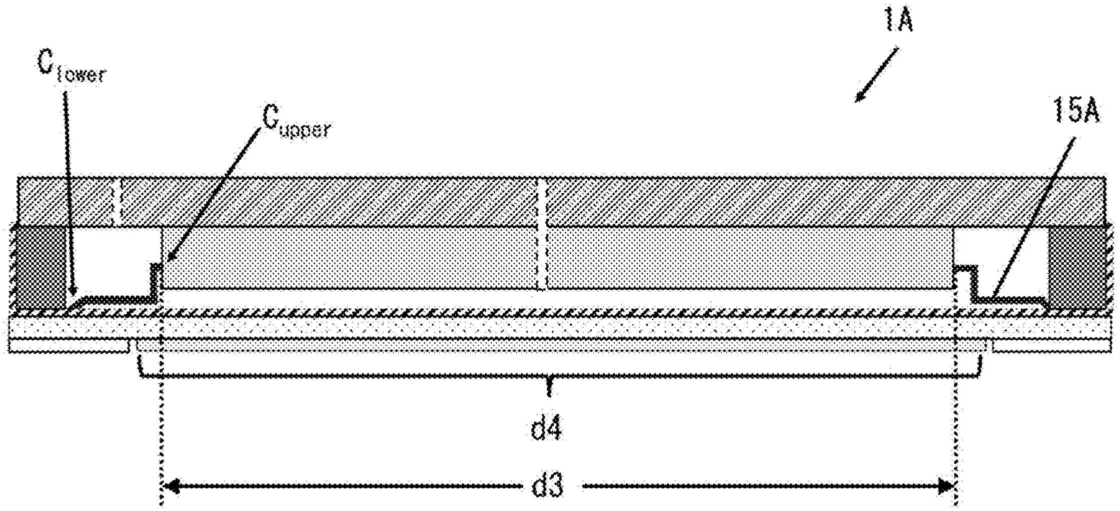
FIG. 3 is an explanatory view of a connection part of the annular partition wall 15A in the polishing head 1A shown in FIG. 1.

FIG. 3 is an explanatory view of the connection part (particularly, the top annular connection part) of the annular partition wall 15A in the polishing head 1A shown in FIG. 1. The annular partition wall 15A is configured such that the top annular connection part $C_{upper}$ is connected with the side surface of the bottom disk-shaped member 10*b* of the closing member. In FIG. 3, two dotted lines are each a straight line drawn toward vertically under the top annular connection part $C_{upper}$. As indicated with the two dotted lines, vertically under the top annular connection part $C_{upper}$, the outer circumferential region of the setting position W of the work to be polished is situated. Herein, the term "outer circumferential region" represents a partial region from the outside circumferential end toward the radial inside. In each drawing of FIGS. 1, and 5 to 7, the top annular connection part $C_{upper}$ of the annular partition wall 15 is connected with the side surface of the bottom disk-shaped member 10*b* of the closing member in any case. For this reason, the part vertically under the top annular connection part $C_{upper}$ is also the part vertically under the side surface of the bottom disk-shaped member 10*b*. In another embodiment, the top annular connection part $C_{upper}$ of the annular partition wall 15 can be connected with the lower surface of the bottom disk-shaped member 10*b*, or the lower surface of the top disk-shaped member 10*a*. In this case, it is assumed that the term "vertically under the top annular connection part $C_{upper}$" represents "vertically under the inside circumferential end of the top annular connection part $C_{upper}$". d3 is smaller than d4, where d3 represents the opening inside diameter of the top annular connection part $C_{upper}$, and d4 represents the outside diameter of the setting position W of the work to be polished. That is, the relationship of "d3<d4" is satisfied. As described previously, with the polishing head in accordance with one aspect of the present invention, for the connection part of the annular partition wall, the outer circumferential region of the setting position of the work to be polished is situated vertically under the top annular connection part, and the inside diameter of the bottom annular connection part is larger than the inside diameter of the second annular member. These enable the following: as compared with the polishing head shown in FIG. 1 of Japanese Patent No. 4833355, the pressure to be applied from the outside space downward can be more effectively controlled by adjusting the amount of the gas to be introduced into the outside space divided with the annular partition wall. This is considered by the present inventors. The present inventors presumes as follows: as a result, it becomes possible to control the polishing amount of the outer circumferential region of the surface to be polished of the work with ease by adjusting the amount of the gas to be introduced into the outside space. With d4 assumed as 100%, d3 is less than 100%, preferably 95% or less, and more preferably 90% or less. Further, from the viewpoint of more increasing the change in polishing amount of the outer circumferential region of the surface to be polished of the work relative to the change in amount of the gas to be introduced into the outside space, with d4 assumed as 100%, d3 is preferably 40% or more, more preferably 50% or more, further preferably 60% or more, still further preferably 70% or more, and still furthermore preferably 80% or more.

Figure 4:
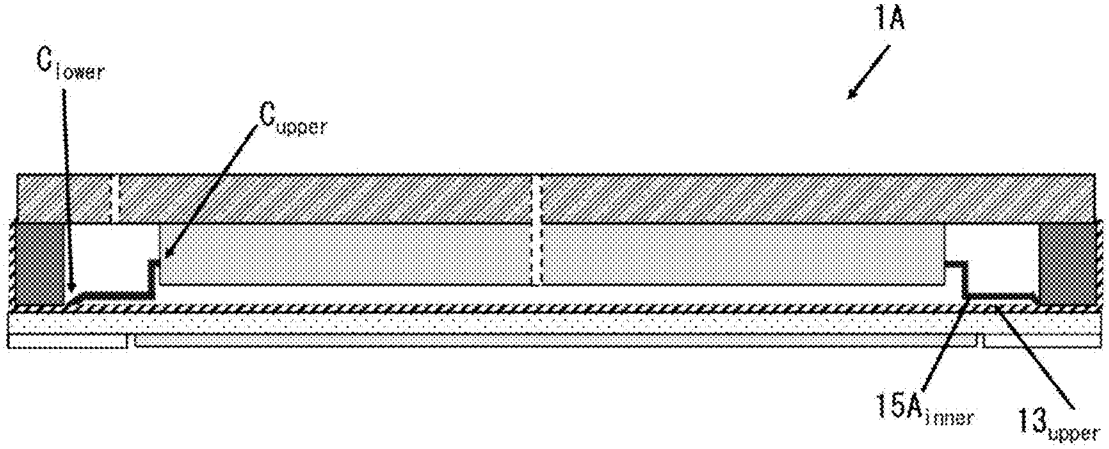
FIG. 4 is an explanatory view of the inner wall surface of the annular partition wall and the upper surface of a membrane.
Figure 5:
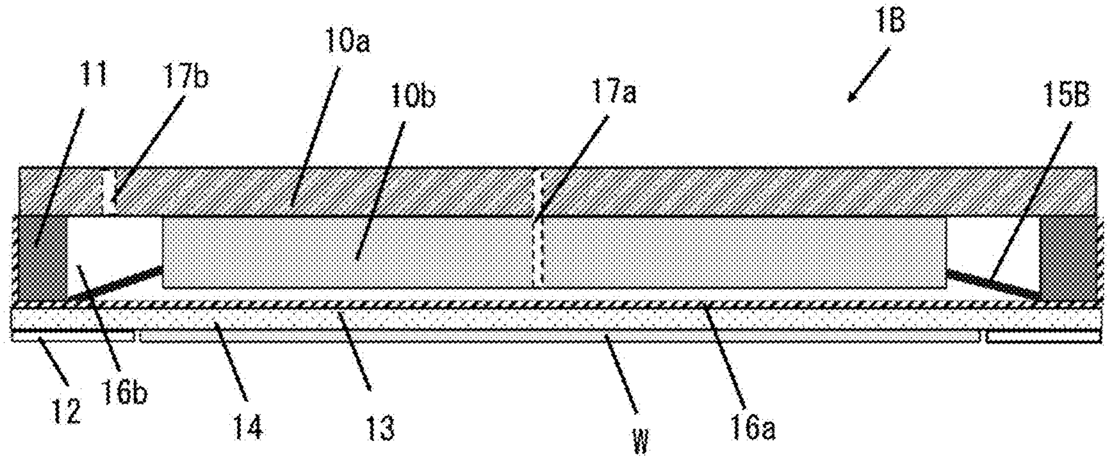
FIG. 5 is a schematic cross-sectional view showing one example of a polishing head in accordance with one aspect of the present invention.
Figure 6:
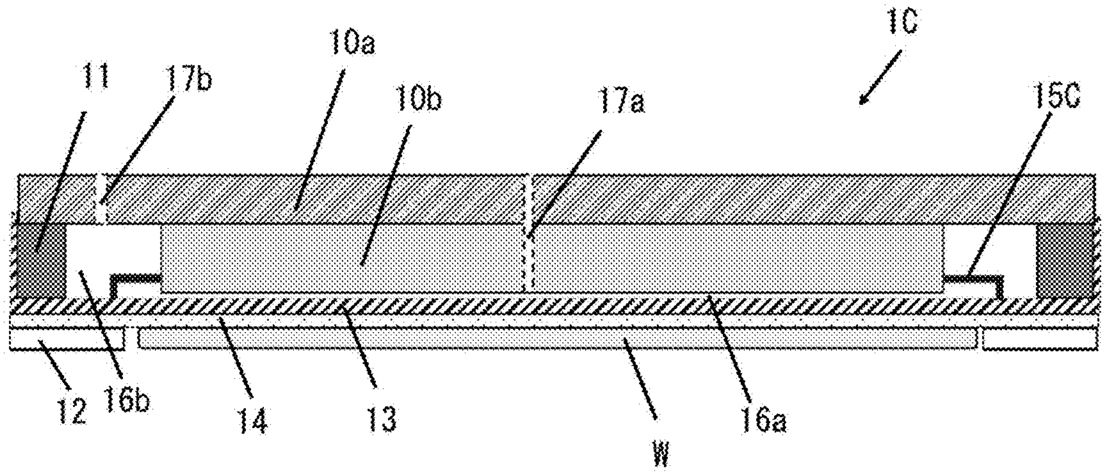
FIG. 6 is a schematic cross-sectional view showing one example of the polishing head in accordance with one aspect of the present invention.
Figure 7:
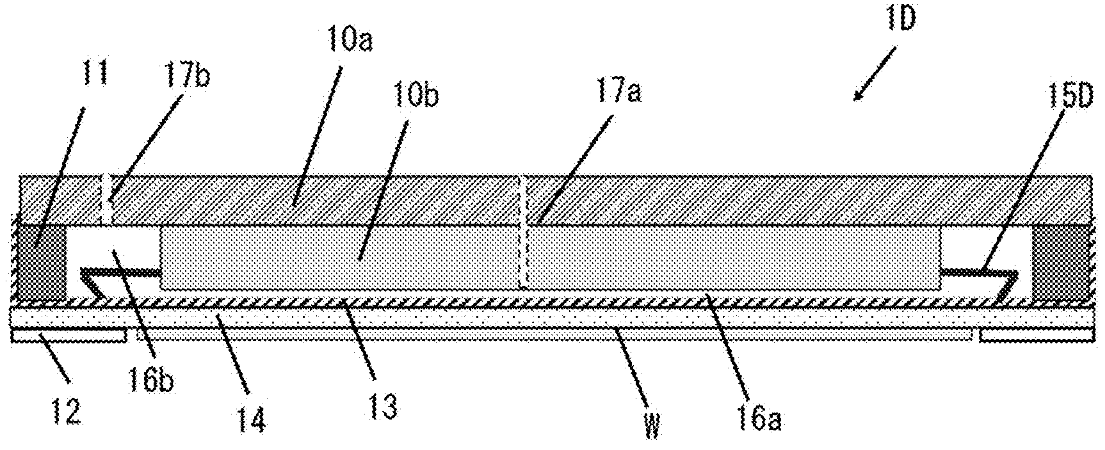
FIG. 7 is a schematic cross-sectional view showing one example of the polishing head in accordance with one aspect of the present invention.

As for the annular partition wall, the cross-sectional shape of the annular partition wall preferably at least partially includes the side surface shape selected from the group consisting of an inclined shape and a horizontal shape, and vertically under at least a part of such a side surface shape, a region including the inside circumferential end of the second annular member and the outside circumferential end of the setting position of the work to be polished is more preferably situated. Having such a configuration can lead to the following: upon introducing a gas into the outside space at the time of polishing, at least a part of the inner wall surface of the annular partition wall comes in contact with the upper surface of the membrane. This can contribute to facilitating the following: by changing the amount of the gas to be introduced into the outside space, the polishing amount in the plane (especially, the outer circumferential region) of the work to be polished is controlled. At the time of polishing, normally, a gas is introduced into both of the outside space and the inside space. A polishing head can have a configuration such that when a gas is introduced into the outside space at the time of polishing, at least a part of the inner wall surface of the annular partition wall comes in contact with the upper surface of the membrane. This can be confirmed by, for example, the following: when a gas is introduced into only the outside space without introducing a gas into the inside space, the upper surface of the membrane and at least a part of the inner wall surface of the partition wall come in contact with each other. FIG. 4 is an explanatory view of the inner wall surface of the annular partition wall and the upper surface of the membrane. In FIG. 4, a reference numeral sign $\mathbf{15}A_{inner}$ represents the inner wall surface of the annular partition wall 15A, and a reference numeral sign $\mathbf{13}_{upper}$ represents the upper surface of the membrane 13.

As the specific examples of the cross-sectional shape, in the example shown in FIG. 1, the cross-sectional shape of the annular partition wall 15A is configured such that horizontal shapes are included at the top and the bottom thereof, and such that an inclined shape continues in a bottom horizontal shape. In the example shown in FIG. 5, the cross-sectional shape of the annular partition wall 15B is an inclined shape. In the example shown in FIG. 6, the cross-sectional shape of the annular partition wall 15C includes a horizontal shape. In the example shown in FIG. 7, the cross-sectional shape of the annular partition wall 15D is configured such that an inclined shape continues in a horizontal shape. For example, in the example shown in FIG. 1, by introducing a gas into the outside space 16*b* at the time of polishing, it is possible to bring a part or the whole of the inner wall surface of the portion in a bottom horizontal shape in a cross-sectional shape into contact with the upper surface of the membrane 13. In the example shown in FIG. 5, by introducing a gas into the outside space 16*b* at the time of polishing, it is possible to bring a part of, or the whole of the inner wall surface of the annular partition wall 15B in an inclined shape in a cross-sectional shape into contact with the upper surface of the membrane 13. In the example shown in FIG. 6, by introducing a gas into the outside space 16*b* at the time of polishing, it is possible to bring a part of, or the whole of the inner wall surface of the portion in a horizontal shape in a cross-sectional shape into contact with the upper surface of the membrane 13. In the example shown in FIG. 7, by introducing a gas into the outside space 16*b* at the time of polishing, it is possible to bring a part of, or the whole of the inner wall surface of the portion in a horizontal shape in a cross-sectional shape into contact with the upper surface of the membrane 13.

[Polishing Device and Method of Manufacturing Semiconductor Wafer]

One aspect of the present invention relates to a polishing device having the above polishing head, a polishing pad, and a surface plate which supports the polishing pad.

Further, another aspect of the present invention relates to a method of manufacturing a semiconductor wafer, including polishing the surface of a semiconductor wafer to be polished by the above polishing device to form a polished surface.

Figure 8:
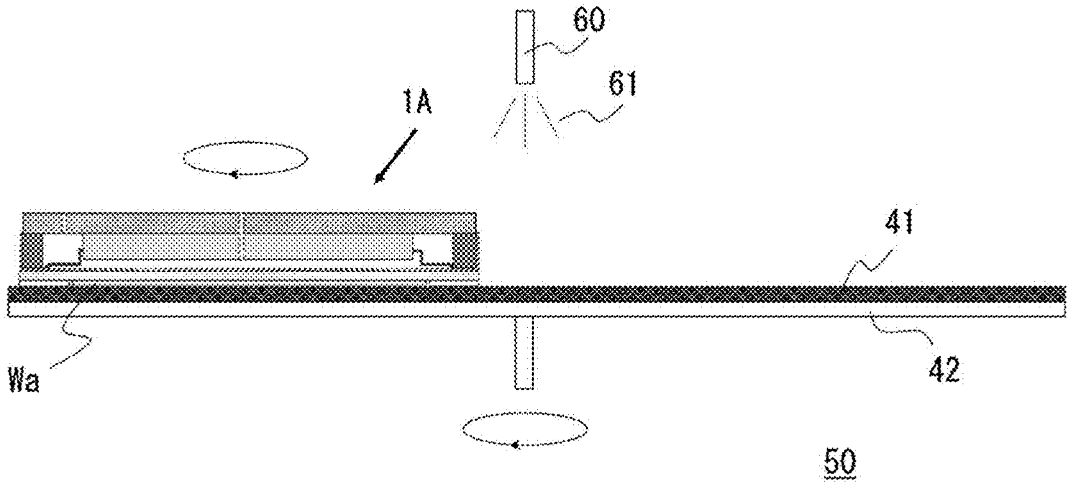
FIG. 8 is a schematic cross-sectional view showing one example of a polishing device in accordance with one aspect of the present invention.

FIG. 8 is a schematic cross-sectional view showing one example of a polishing device in accordance with one aspect of the present invention. A polishing device 50 shown in FIG. 8 includes the polishing head 1A shown in FIG. 1. As with FIG. 1, or the like, the head main body of the polishing head is not shown. The polishing device 50 is a one-side polishing device of a rubber chuck system, whereby while rotating the polishing head 1A and the surface plate 42 by a rotating mechanism (not shown), respectively, the surface to be polished of a work to be polished Wa set at the setting position W of the polishing head 1A is brought into sliding contact with a polishing pad 41 bonded onto the surface plate 42. An abrasive 61 discharged from an abrasive supply mechanism 60 is supplied to between the lower surface of the work Wa that is the surface to be polished of the work Wa, and the polishing pad 41. Thus, the surface to be polished of the work Wa is polished. As the abrasive, a polishing slurry commonly used for CMP (Chemical Mechanical Polishing) can be used. The above polishing device can have the same configuration as that of a normal one-side polishing device except for including the polishing head in accordance with one aspect of the present invention. Further, to the above method of manufacturing a semiconductor wafer, a known technology regarding the method of manufacturing a semiconductor wafer having a polished surface is applicable except for including polishing the surface of a semiconductor wafer to be polished using the polishing device in accordance with one aspect of the present invention to form a polished surface. The wafer to be polished can be, for example, a silicon wafer (preferably, a single crystal silicon wafer). For example, a silicon wafer can be manufactured in the following manner. A single crystal silicon ingot is cut, resulting in a block. The single crystal silicon ingot can be grown by a known method such as the CZ method (Czochralski method) or the FZ method (Floating Zone method). The resulting block is sliced, resulting in a wafer. The wafer is subjected to various processings. As a result, a silicon wafer can be manufactured. As the processings, mention may be made of chamfering processing, flattening processing (lapping, grinding, or polishing), and the like. The above polishing device can be preferably used for, for example, the finish polishing step of the final step of wafer processing.

EXAMPLES

Below, the present invention will be described by way of Examples. However, the present invention is not limited to the embodiments shown in Examples. The polishing pressure Pe described below is the pressure to be applied from the outer circumferential region of the membrane 13 downward due to swelling of the outer circumferential region of the membrane 13 caused by introduction of a gas into the outside space 16*b* through the gas introduction path 17*b*. The polishing pressure Pc is the pressure to be applied from the central part of the membrane 13 downward due to swelling of the central part of the membrane 13 caused by introduction of a gas into the inside space 16*a* through the gas introduction path 17*a*. The polishing pressures Pe and Pc are experimental values.

[Polishing Head]

The polishing head (the two-zone membrane head of the rubber chuck system) of Example 1 is the polishing head with the configuration shown in FIG. 1. The inside diameter d1 of the bottom annular connection part of the annular partition wall, the inside diameter d2 of the second annular member, the opening inside diameter d3 of the top annular connection part of the annular partition wall, and the outside diameter d4 of the setting position of the work to be polished are the values shown in Table 1, respectively.

The polishing head of Example 2 is the polishing head with the same configuration as that of the polishing head of Example 1, except that d3 is set as the value shown in Table 1.

With each polishing head of Example 1 and Example 2, the inside diameter d1 of the bottom annular connection part $C_{lower}$ of the annular partition wall 15A is larger than the inside diameter d2 of the second annular member, and the outer circumferential region of the setting position W of the work to be polished is situated vertically under the top annular connection part $C_{upper}$ of the annular partition wall 15A. For the polishing heads of Example 1 and Example 2, it has been confirmed as follows: when a gas is introduced into only the outside space without introducing a gas into the inside space, at least a part of the inner wall surface of the partition wall (particularly, a part of or the whole of the inner wall surface of the portion in a bottom horizontal shape in a cross-sectional shape) comes in contact with the upper surface of the membrane.

Each polishing head of Comparative Example 1 and Comparative Example 2 is a polishing head with the same configuration as that of the polishing head of Example 1, except that d1 and d3 are set as the values shown in Table 1.

With the polishing head of Comparative Example 1, the inside diameter d1 of the bottom annular connection part $C_{lower}$ of the annular partition wall 15A is smaller than the inside diameter d2 of the second annular member (d1<d2). Therefore, at the time of polishing, the second annular member 12 is situated vertically under the bottom annular connection part $C_{lower}$ of the annular partition wall 15A.

With the polishing head of Comparative Example 2, although the inside diameter d1 of the bottom annular connection part $C_{lower}$ of the annular partition wall 15A is roughly equal to the inside diameter d2 of the second annular member, the relationship of "d1<d2" is satisfied. Therefore, at the time of polishing, the second annular member 12 is situated vertically under the bottom annular connection part $C_{lower}$ of the annular partition wall 15A.

TABLE 1

| | Annular partition wall Inside diameter d1 of bottom annular connection part | Second annular member Inside diameter d2 | Annular partition wall Opening inside diameter d3 of top annular connection part | Setting position of work Outside diameter d4 |
|---|---|---|---|---|
| Example 1 | 320 mm (106% with d2 assumed as 100%) | 301 mm | 200 mm (67% with d4 assumed as 100%) | 300 mm |
| Example 2 | 320 mm (106% with d2 assumed as 100%) | 301 mm | 260 mm (87% with d4 assumed as 100%) | 300 mm |
| Comparative Example 1 | 270 mm (d1 < d2) | 301 mm | 260 mm (87% with d4 assumed as 100%) | 300 mm |
| Comparative Example 2 | 300 mm (d1 < d2) | 301 mm | 290 mm (97% with d4 assumed as 100%) | 300 mm |

[Polishing Process of Silicon Wafer]

In the following polishing process, a plurality of silicon wafers cut out under the same cutting conditions from the same single crystal silicon ingot, and subjected to various processings under the same conditions were subjected to a one-side polishing process as the finish polishing step of the final step.

As the polishing device of Example 1, a polishing device with the configuration shown in FIG. 8 including the polishing head of Example 1 was prepared. With the polishing device, the one-side polishing process of the silicon wafer was carried out. The three silicon wafers were respectively subjected to a one-side polishing process under the following polishing conditions.

$$Pc = 10 \text{ kPa}$$

$$Pe = 8 \text{ kPa, } 10 \text{ kPa, or } 12 \text{ kPa}$$

A polishing device of Example 2 was the same as the polishing device of Example 1, except that the polishing head was set as the polishing head of Example 2. With the polishing device, three silicon wafers were respectively subjected to a one-side polishing process by the method described for Example 1.

Also for Comparative Example 1 and Comparative Example 2, similarly, using the polishing head of each Comparative Example as the polishing head, three silicon wafers were respectively subjected to a one-side polishing process by the method described for Example 1.

[Evaluation of Change in Polishing Amount Due to Change in Polishing Pressure Pe]

As for each silicon wafer subjected to a polishing process in Example 1, Example 2, Comparative Example 1, and Comparative Example 2, using a geometric measurement system WaferSight manufactured by KLA-Tencor Co., as a measuring device, (i) the wafer thickness at wafer center (described as a "wafer center thickness"); and (ii) the arithmetic average of wafer thicknesses at 72 equally spaced sites around the entire circumference at positions of 10 mm radially inward from the wafer outside circumferential end (described as a "wafer outer circumference thickness")

were determined.

Figure 9:
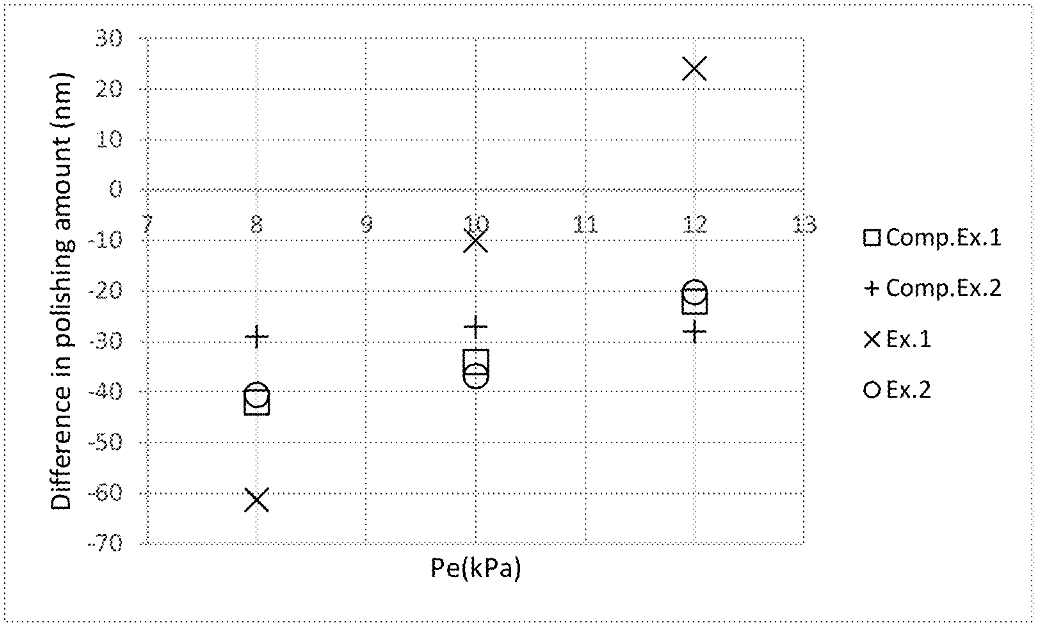
FIG. 9 is a graph plotting the difference in polishing amount relative to the polishing pressure Pe for Example 1, Example 2, Comparative Example 1, and Comparative Example 2.

As for each silicon wafer subjected to a polishing process, the difference in polishing amount was calculated as "difference in polishing amount=wafer center thickness−wafer outer circumference thickness". FIG. 9 shows a graph plotting the difference in polishing amount relative to the polishing pressure Pe for Example 1, Example 2, Comparative Example 1, and Comparative Example 2. As indicated with the graph of FIG. 9, in Comparative Example 2, the degree of change in value of the difference in polishing amount relative to the change in value of the polishing pressure Pe was smaller than those of Example 1, Example 2, and Comparative Example 1.

[Evaluation on Fluctuations in Polishing Amount]

Figure 10:
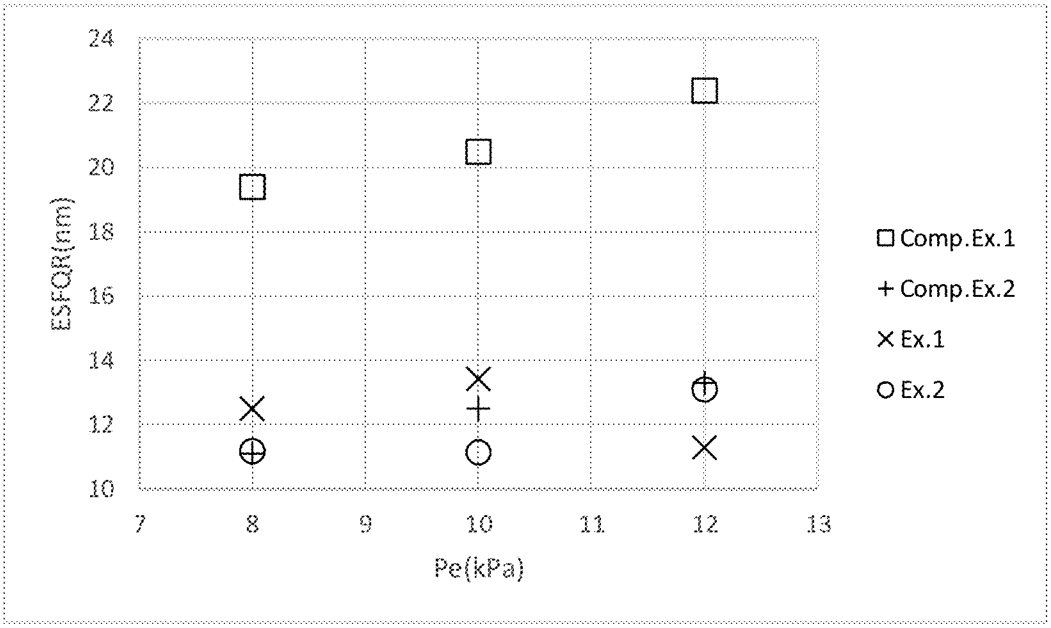
FIG. 10 shows a graph plotting ESFQR relative to the polishing pressure Pe for Example 1, Example 2, Comparative Example 1, and Comparative Example 2.

As for each silicon wafer subjected to a polishing process in Example 1, Example 2, Comparative Example 1, and Comparative Example 2, using a geometric measurement system WaferSight manufactured by KLA-Tencor Co., as a measuring device, ESFOR of the index for the outer circumferential region flatness of the wafer was determined. The ESFOR is the abbreviation of Edge site flatness front reference least square range (abbreviation obtained by connecting the underlined letters). The ESFOR is determined as the value obtained in the following manner: with the measuring device, a site is set in the outer circumferential region of the wafer surface subjected to a polishing process; the site is radially divided into a plurality of sectors; and the minimum displacement is added to the maximum displacement from the best fit surface at the site. The dividing conditions for the sector were set as 72 sectors, a Length of 15 mm, and a Width of 5°. FIG. 10 shows a graph plotting ESFQR relative to the polishing pressure Pe for Example 1, Example 2, Comparative Example 1, and Comparative Example 2. As indicated with the graph of FIG. 10, in Comparative Example 1, for any Pe, the value of ESFQR was larger than that of Example 1, Example 2, and Comparative Example 2 (i.e., the outer circumferential region flatness of the wafer subjected to a polishing process was lower). The reason why the outer circumferential region flatness was lower for the wafer subjected to a polishing process by the polishing device of Comparative Example 1 can be considered as follows: with the polishing device of Comparative Example 1, the outer circumferential region of the wafer surface to be polished is situated under the bottom annular connection part of the annular partition wall; and hence, it was not easy to control the polishing pressure to be applied to under the bottom annular connection part.

From the results described above, it can be confirmed as follows. In the polishing process with the polishing devices of Example 1 and Example 2, it is possible to control the polishing amount of the outer circumferential region of the surface to be polished of the work by changing the polishing pressure Pe, and it is also possible to suppress fluctuations in local polishing amount at the surface to be polished.

One aspect of the present invention is useful in the technical field of a semiconductor wafer such as a silicon wafer.

The invention claimed is:

1. A polishing head, which comprises:

a first annular member, a closing member, including at least a top disk-shaped member and a bottom disk-shaped member, which is configured to close an upper surface side opening of an opening of the first annular member, a membrane which closes a lower surface side opening of the opening of the first annular member, and a second annular member situated under the membrane and having an opening which holds a work to be polished, wherein:

with a first radial direction toward a center of the opening of the first annular member assumed as an inside, and with a second radial direction away from the center of the opening of the first annular member assumed as an outside, a space, which is formed by closing the opening of the first annular member with the closing member and the membrane, is partitioned into an inside space and an outside space with an annular partition wall having a top annular connection part connected to the closing member and a bottom annular connection part connected to the membrane, an inside diameter of the bottom annular connection part of the annular partition wall is larger than an inside diameter of the second annular member, and an outer circumferential region of a setting position of the work to be polished is situated vertically under the top annular connection part of the annular partition wall.

2. The polishing head according to claim 1, wherein:

the annular partition wall comprises a side surface shape selected from the group consisting of an inclined shape and a horizontal shape in a cross-sectional shape, and vertically under at least a part of the side surface shape, an inside circumferential end of the second annular member and an outside circumferential end of the setting position of the work to be polished are situated.

3. The polishing head according to claim 1, wherein:

the closing member comprises top disk-shaped member and the bottom disk-shaped member with a smaller outside diameter than that of the top disk-shaped member, and in the annular partition wall, the top annular connection part is connected to a side surface of the bottom disk-shaped member.

4. The polishing head according to claim 1, which further comprises a back pad between the membrane and the second annular member.

5. The polishing head according to claim 1, which comprises:

a first introduction path which introduces a gas into the inside space, and a second introduction path which introduces a gas into the outside space.

6. A polishing device, which comprises:

the polishing head according to claim 1, a polishing pad, and a surface plate which supports the polishing pad.

7. A method of manufacturing a semiconductor wafer, which comprises polishing a surface of a semiconductor wafer to be polished with the polishing device according to claim 6 to form a polished surface.

* * * * *